(12) United States Patent
Pfitzer et al.

(10) Patent No.: US 7,948,778 B2
(45) Date of Patent: May 24, 2011

(54) SELF-TESTING POWER SUPPLY APPARATUS, METHODS AND COMPUTER PROGRAM PRODUCTS

(75) Inventors: Hans-Erik Pfitzer, Wake Forest, NC (US); Rune Lennart Jonsson, Raleigh, NC (US); John G. Tracy, Raleigh, NC (US); Miguel E. Chavez, Raleigh, NC (US); Frederick Tassitino, Jr., Wake Forest, NC (US); Jason S. Anderson, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 12/136,160

(22) Filed: Jun. 10, 2008

(65) Prior Publication Data

US 2008/0265681 A1 Oct. 30, 2008

Related U.S. Application Data

(63) Continuation of application No. 10/879,441, filed on Jun. 29, 2004, now abandoned.

(51) Int. Cl.
*H02M 5/40* (2006.01)
*H02M 7/10* (2006.01)
(52) U.S. Cl. ............................... 363/34; 363/50
(58) Field of Classification Search ............ 363/34, 363/37, 50, 123, 125, 131; 307/64, 66
See application file for complete search history.

(56) References Cited

U.S. PATENT DOCUMENTS

| 6,295,215 | B1 * | 9/2001 | Faria et al. | 363/37 |
|---|---|---|---|---|
| 6,605,879 | B2 * | 8/2003 | Wade et al. | 307/66 |
| 6,844,706 | B2 * | 1/2005 | Pinkerton et al. | 322/29 |
| 6,906,933 | B2 * | 6/2005 | Taimela | 363/37 |
| 7,050,312 | B2 * | 5/2006 | Tracy et al. | 363/37 |
| 7,400,066 | B2 * | 7/2008 | Tassitino et al. | 307/46 |
| 7,652,397 | B2 * | 1/2010 | Lin et al. | 307/147 |
| 7,667,351 | B2 * | 2/2010 | Marwali et al. | 307/87 |
| 2003/0227785 | A1 * | 12/2003 | Johnson, Jr. | 363/37 |
| 2004/0085785 | A1 | 5/2004 | Taimela | |

OTHER PUBLICATIONS

Chen et al., "The Burn-in Test of Three-Phase UPS by Energy Feedback Method," PESC 93,. Seattle, Washington, 1993, pp. 766-771.
Chu et al, "Self-Load Bank for UPS Testing by Circulating Current Method," IEE Proc.-Electri. Power Appl., vol. 141, No. 4, Jul. 1994, pp. 191-196.
Tsai, M.T., "Comparative investigation of the energy recycler for power electronics burn-in test," IEE Proceedings: Electric Power Applications, Institution of Electrical Engineers, May 11, 2000, pp. 1920198.
International Search Report, PCT?US2005/018480, Sep. 9, 2005.

\* cited by examiner

*Primary Examiner* — Adolf Berhane
(74) *Attorney, Agent, or Firm* — Myers Bigel Sibley & Sajovec, P.A.

(57) ABSTRACT

A power supply apparatus includes first and second parallel-connected uninterruptible power supplies (UPSs), each including an AC/DC converter circuit and a DC/AC converter circuit having an input coupled to an output of the AC/DC converter circuit by a DC link, inputs of the AC/DC converter circuits of the first and second UPSs connected in common to an AC source and outputs of the DC/AC converter circuits of the first and second UPSs connected in common to a load. The first and second UPSs are configured to support a test mode wherein the first UPS is test loaded by transferring power from the output of the DC/AC converter circuit of the first UPS to the output of the DC/AC converter circuit of the second UPS. The first UPS may be configured to provide power to the load concurrent with test loading by the second UPS.

6 Claims, 10 Drawing Sheets

SELF-TESTING POWER SUPPLY APPARATUS, METHODS AND COMPUTER PROGRAM PRODUCTS

CROSS-REFERENCE TO RELATED APPLICATION

This application is a continuation of U.S. patent application Ser. No. 10/879,441, filed on Jun. 29, 2004 now abandoned, the disclosure of which is hereby incorporated herein by reference in its entirety.

BACKGROUND OF THE INVENTION

The invention relates to power supplies, and more particularly, to testing of power supplies.

A typical conventional large-capacity "on-line" UPS may include an AC/DC converter (e.g., a rectifier) that is configured to be coupled to an AC power source, such as a utility source, and a DC/AC converter (e.g., an inverter) that is coupled to the AC/DC converter by a DC link and which produces an AC voltage at an output (load) bus of the UPS. The UPS may further include a bypass circuit, e.g., a static switch, which can be used to couple the AC power source directly to the output bus of the UPS, such that the AC/DC converter and DC/AC converter are bypassed. The bypass circuit can be used, for example, to provide an economy mode of operation and/or to provide power to the load when either or both of the converters are damaged or inoperative.

Factory testing of such a UPS is often performed with a resistive, reactive load and/or a non-linear test load. Performing such tests may require extensive infrastructure, including the loads themselves and a sufficiently high-capacity utility infrastructure to supply the power for the testing. Additionally, significant energy costs may be entailed in such testing, as the energy delivered to the test load in load testing is often dissipated as heat. Such costs may be replicated when the UPS is installed at the customer's premises, where a commissioning test may be performed at installation to ensure that the UPS and associate power delivery components, e.g., lines, switches, breakers and the like, operate as intended at rated load.

Techniques for recycling energy in UPS bum-in testing are described in articles entitled "The Burn-in Test of Three-Phase UPS by Energy Feedback Methods," by Chen et al., PESC 93 in Seattle Wash., U.S.A., (1993), and "Self-load bank for UPS testing by circulating current method," by Chu et al., IEE Proc.-Electr. Power Appl., Vol. 141, No. 4 (July 1994). Each of these techniques, however, utilize specialized test equipment that can lead to extra cost, and which can make the test techniques less useful for field testing.

SUMMARY OF THE INVENTION

Some embodiments of the present invention provide methods of operating a power supply apparatus including first and second parallel-connected uninterruptible power supplies (UPSs), each including an AC/DC converter circuit and a DC/AC converter circuit having an input coupled to an output of the AC/DC converter circuit by a DC link, inputs of the AC/DC converter circuits of the first and second UPSs connected in common to an AC source and outputs of the DC/AC converter circuits of the first and second UPSs connected in common to a load. In such methods, the first UPS is test loaded by transferring power from the output of the DC/AC converter circuit of the first UPS to the output of the DC/AC converter circuit of the second UPS. Power may be provided to the load from the first UPS concurrent with test loading the first UPS by transferring power from the output of the DC/AC converter circuit of the first UPS to the output of the DC/AC converter circuit of the second UPS. Power may be transferred from the input of the AC/DC converter circuit of the second UPS to the input of the AC/DC converter circuit of the first UPS concurrent with test loading the first UPS by transferring power from the output of the DC/AC converter circuit of the first UPS to the output of the DC/AC converter circuit of the second UPS.

Further embodiments of the present invention provide power supply apparatus including first and second parallel-connected uninterruptible power supplies (UPSs), each including an AC/DC converter circuit and a DC/AC converter circuit having an input coupled to an output of the AC/DC converter circuit by a DC link, inputs of the AC/DC converter circuits of the first and second UPSs connected in common to an AC source and outputs of the DC/AC converter circuits of the first and second UPSs connected in common to a load. The first and second UPSs are configured to support a test mode wherein the first UPS is test loaded by transferring power from the output of the DC/AC converter circuit of the first UPS to the output of the DC/AC converter circuit of the second UPS. The first UPS may be configured to provide power to the load concurrent with test loading the first UPS by transferring power from the output of the DC/AC converter circuit of the first UPS to the output of the DC/AC converter circuit of the second UPS. The second UPS may be configured to control the AC/DC converter circuit of the second UPS to transfer power from the input of the AC/DC converter circuit of the second UPS to the input of the AC/DC converter circuit of the first UPS concurrent with test loading the first UPS by transferring power from the output of the DC/AC converter circuit of the first UPS to the output of the DC/AC converter circuit of the second UPS.

DETAILED DESCRIPTION OF EXEMPLARY EMBODIMENTS

Figure 1:
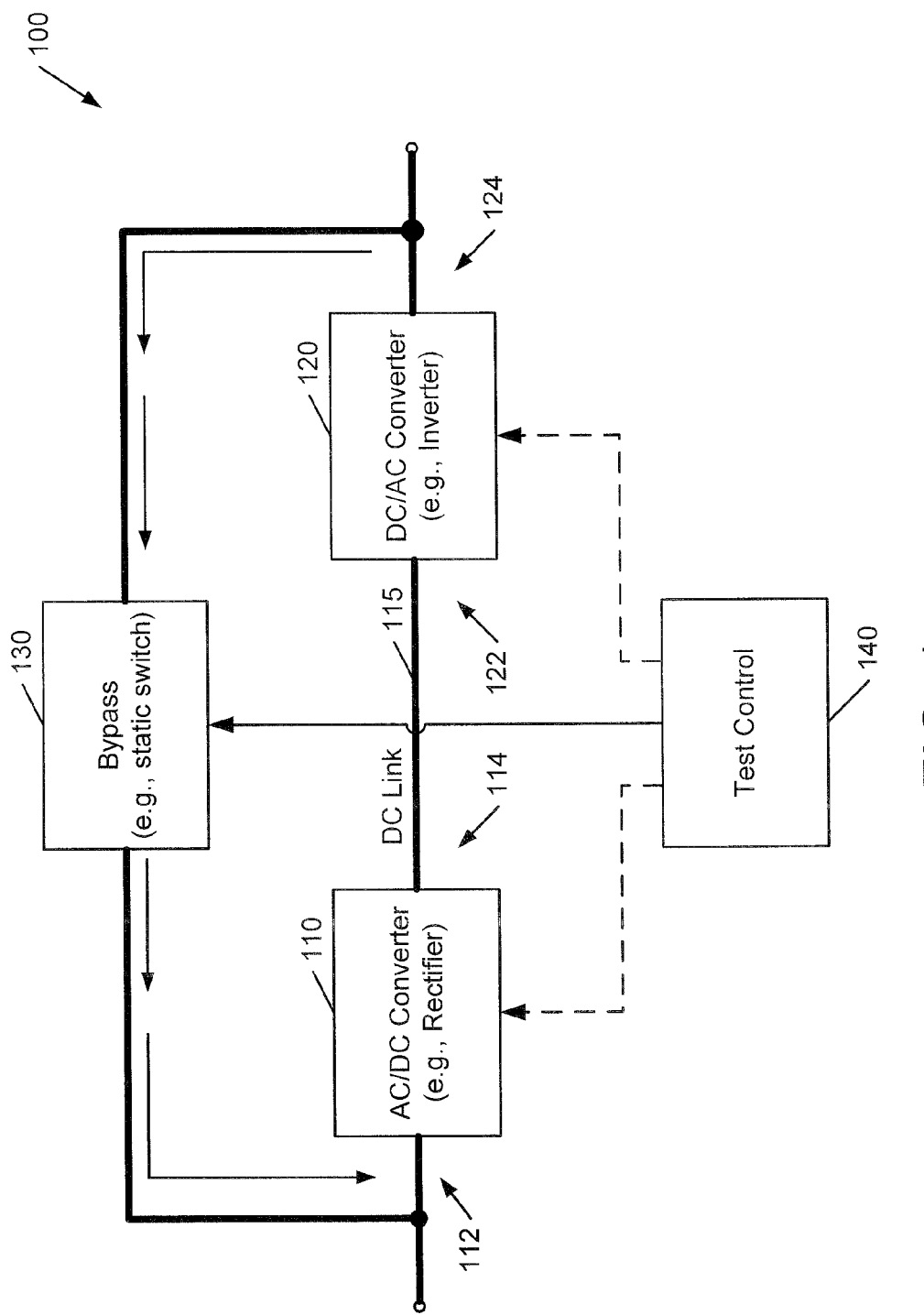
FIGS. 1-3 are schematic diagrams illustrating power supply apparatus according to various embodiments of the invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be appreciated by one of skill in the art, the invention may be embodied as apparatus, methods and computer program products. Embodiments of the invention may include hardware and/or software. Furthermore, the invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the invention may be written in an object oriented programming language such as Java®, Smalltalk or C++. However, the computer program code for carrying out operations of the invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Embodiments of the invention include circuitry configured to provide functions described herein. It will be appreciated that such circuitry may include analog circuits, digital circuits, and combinations of analog and digital circuits.

The invention is described below with reference to block diagrams and/or operational illustrations of methods, apparatus and computer program products according to various embodiments of the invention. It will be understood that each block of the block diagrams and/or operational illustrations, and combinations of blocks in the block diagrams and/or operational illustrations, can be implemented by analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational illustrations. In some alternate implementations, the functions/acts noted in the figures may occur out of the order noted in the block diagrams and/or operational illustrations. For example, two operations shown as occurring in succession may, in fact, be executed substantially concurrently or the operations may sometimes be executed in the reverse order, depending upon the functionality/acts involved.

FIG. 1 illustrates a power supply apparatus 100 according to some embodiments of the invention. The apparatus 100, which may be incorporated in, for example, an on-line UPS, includes an AC/DC converter circuit 110 (e.g., a rectifier) having an input 112 configured to be coupled to an AC source (not shown), and an output 114 coupled to a DC link 115. The AC/DC converter circuit 110 is operative to power the DC link 115 from AC power provided at its input 112. The apparatus 100 also includes a DC/AC converter circuit 120 (e.g., an inverter) having an input 122 coupled to the DC link 115 and an output 124 configured to be coupled to a load (not shown). The DC/AC converter circuit 120 is operative to provide AC power at its output from DC power provided via the DC link 115. The apparatus 100 further includes a bypass circuit (e.g., a static switch) 130 that is operative to couple and decouple the input 112 of the AC/DC converter circuit 110 and the output 124 of the DC/AC converter circuit 120.

The apparatus 100 also includes a test control circuit 140 that controls the AC/DC converter circuit 110 and/or the DC/AC converter circuit 120 (i.e., either or both, as shown by dashed lines), and which also controls the bypass circuit 130. More particularly, the test control circuit 140 is operative to cause the bypass circuit 130 to couple the output 124 of the DC/AC converter circuit 120 to the input 112 of the AC/DC converter circuit 110, and to control the AC/DC converter circuit 110 and/or the DC/AC converter circuit 120 to cause power transfer from the output 124 of the DC/AC converter circuit 120 to the input 112 of the AC/DC converter circuit 110 via the bypass circuit 130 to thereby conduct a test, e.g., a burn-in, commissioning, or other test, of the apparatus 100.

Figure 2:
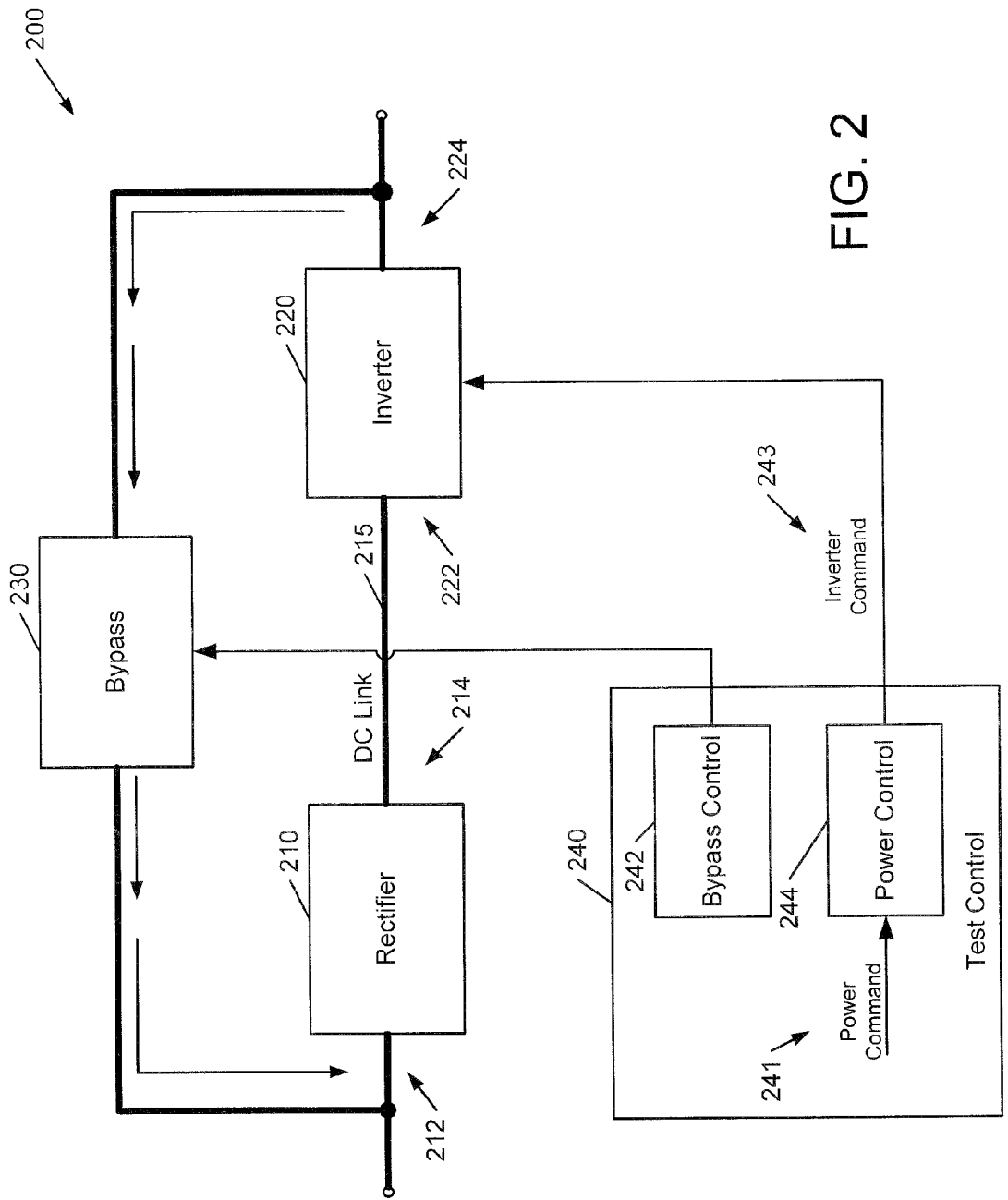

FIG. 2 illustrates a power supply apparatus 200 according to further embodiments of the invention. The apparatus 200, which may be, for example, an on-line UPS, includes an AC/DC converter circuit a rectifier circuit 210 having an input 212 configured to be coupled to an AC source (not shown), and an output 214 coupled to DC link 215. The rectifier circuit 110 is operative to transfer power between the DC link 215 and an AC power source (not shown) at its input 212. The apparatus 200 also includes an inverter circuit 220 having an input 222 coupled to the DC link 215 and an output 224 configured to be coupled to an AC load (not shown). The inverter circuit 220 is operative to transfer power between the DC link 215 and the AC load. The apparatus 200 further includes a bypass circuit (e.g., a static switch) 230 that is operative to couple and decouple the input 212 of the rectifier circuit 210 and the output 224 of the inverter circuit 220.

The apparatus 200 also includes a test control circuit 240 that controls the inverter circuit 220 and the bypass circuit 230. The test control circuit 240 includes a bypass control circuit 242 that is operative to cause the bypass circuit 230 to couple the output 224 of the inverter circuit 220 to the input 212 of the rectifier circuit 210, and a power control circuit 244 operative to control the inverter circuit 220 to cause power transfer from the output 224 of the inverter circuit 220 to the input 212 of the AC/DC converter circuit 210 via the bypass circuit 230 to conduct a test of the apparatus 200. In particular, the power control circuit 244 is operative to generate a command signal 243 for control circuitry (e.g., current mode PWM control loop circuitry) of the inverter circuit 220 responsive to a power command signal 241, which may, for example, include a real and/or reactive component. For example, the power command signal 241 may command the inverter circuit 220 to transfer power so as to effect a desired loading of the inverter circuit 220, such that components of the UPS, such as power transistors in the rectifier circuit 210 and/or the inverter circuit 220 and associated control electronics and sensors, may be tested at the desired load.

During such testing, the rectifier circuit 210 may operate as it would during normal operation of the UPS, e.g., the rectifier circuit 210 may operate to regulate a DC voltage on the DC link 215 in both normal and test modes. It will be appreciated that, in such an implementation, the rectifier circuit 210 may respond to current demands at the DC link 215 created by the power transfer operations of the inverter circuit 220. Alternatively, as discussed in detail below with reference to FIG. 5, the rectifier circuit 210 may also be controlled by the test control circuit 240 to provide desired power transfer or other characteristics during testing.

Figure 3:
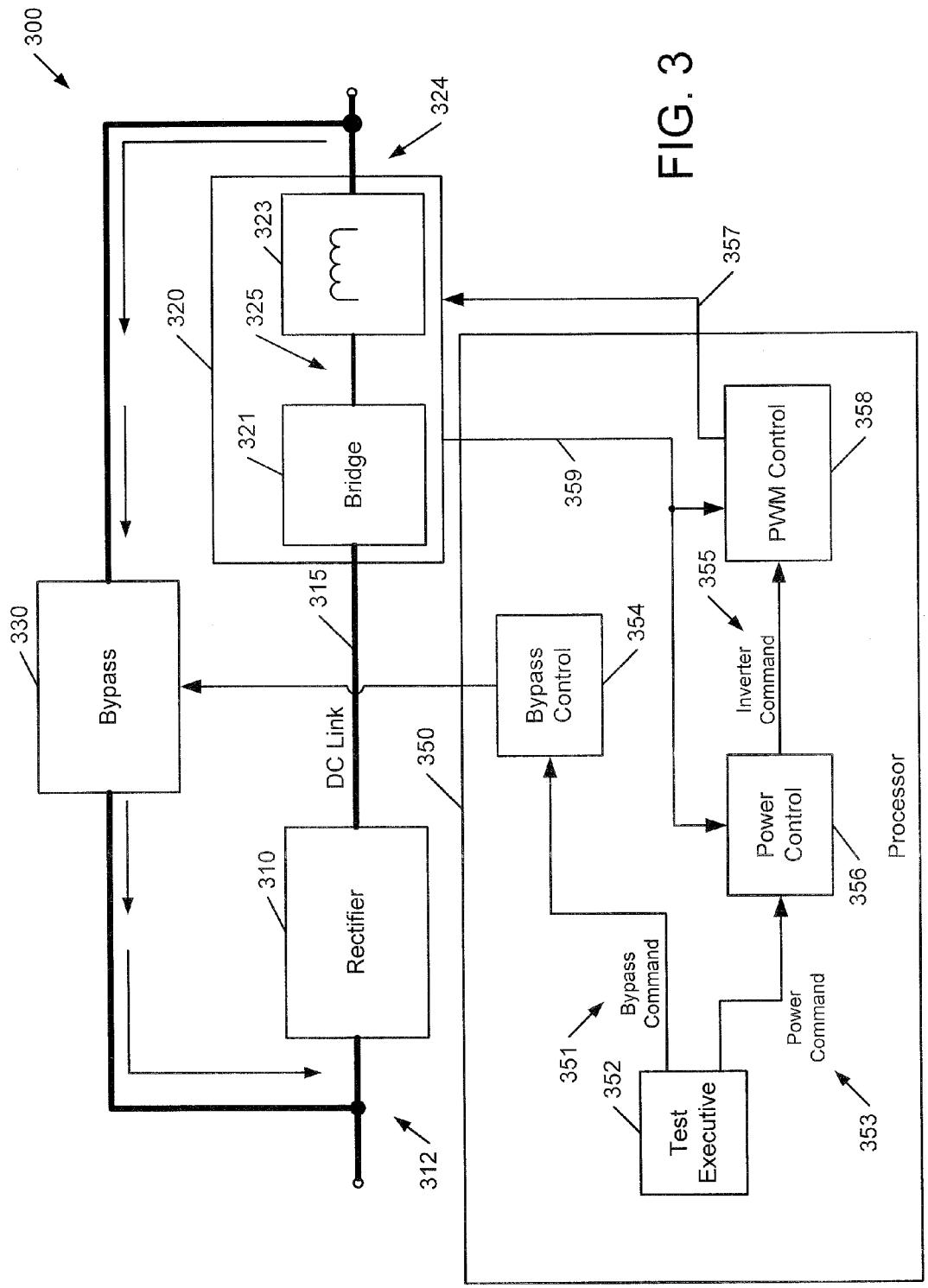

FIG. 3 illustrates an exemplary control configuration for an implementation of a power supply apparatus along the lines of FIG. 2 according to further embodiments of the invention. FIG. 3 illustrates a power supply apparatus 300 that includes a rectifier circuit 310 having an input 312 configured to be coupled to an AC power source (not shown). The rectifier circuit 310 is operative to transfer power between a DC link 315 and the AC power source. The apparatus 300 also includes an inverter circuit 320 coupled to the DC link 315 and an output 324 configured to be coupled to a load (not shown). The inverter circuit 320 is operative to transfer power between its output 324 and the DC link 315, and includes a bridge circuit 321 (e.g., an active bridge including one or more pairs of insulated gate bipolar transistors (IGBTs) arranged in a half-bridge configuration) coupled to the DC link 315 and an impedance (e.g., an inductor) 323 coupled to the output 324. The apparatus 300 further includes a bypass circuit (e.g., a static switch) 330 that is operative to couple and decouple the input 312 of the rectifier circuit 310 and the output 324 of the inverter circuit 320.

The apparatus 300 also includes test control circuitry for the inverter circuit 320 and the bypass circuit 330 implemented as functional blocks embodied in a processor 350, such as a microprocessor, microcontroller, DSP, or combination thereof. The control circuitry includes a PWM control block 358 that provides one or more pulse-width modulation control signals 357 to the inverter circuit 320 to control operation of the bridge circuit 321. The PWM control block 358 operates responsive to an inverter command signal 355 and one or more feedback signals 359 (e.g., signals representative of voltage and/or currents) associated with operation of the inverter circuit 320. The inverter command signal 355 represents a reference for operation of a control loop for the inverter circuit 320 implemented by the PWM control block 358.

One or more of the feedback signals 359 are also provided to a power control block 356, also implemented in the processor 350, which also receives a power command signal 353, e.g., a signal representative of a real and/or reactive power to be produced by the inverter circuit 320. Responsive to the power command signal 353 and the one or more feedback signals 359, the power control block 356 produces the inverter command signal 355 that is supplied to the PWM control block 358. In this manner, a voltage magnitude and phase at a node 325 of the bridge circuit 321 may be varied to effect a desired power transfer at the output 324 of the inverter circuit 320. A test executive block 352 produces the power command signal 353, and also provides a bypass command signal 351 to a bypass control block 354 implemented in the processor 350. The bypass control block 354 responsively controls the bypass circuit 330 to couple and decouple the output 324 of the inverter circuit 320 and the input 312 of the rectifier circuit 312.

It will be appreciated that the test executive block 352 may be configured to provide various configurations and operations of the apparatus 300 needed to conduct tests, such as loading tests, of the apparatus 300. The test executive block 352 may be further configured to monitor status of components of the apparatus 300 during testing, such as voltages and/or current produced by the apparatus 300, failures of components of the apparatus 300, temperatures of various locations in the apparatus, and the like. It will also be understood that several of the component blocks implemented in processor 350 may serve functions other than the test control functions described above. For example, the power control block 356 and/or the PWM control block 358 may also be used for inverter control during "normal" operations using control blocks other than the test executive block 352.

Figure 4:
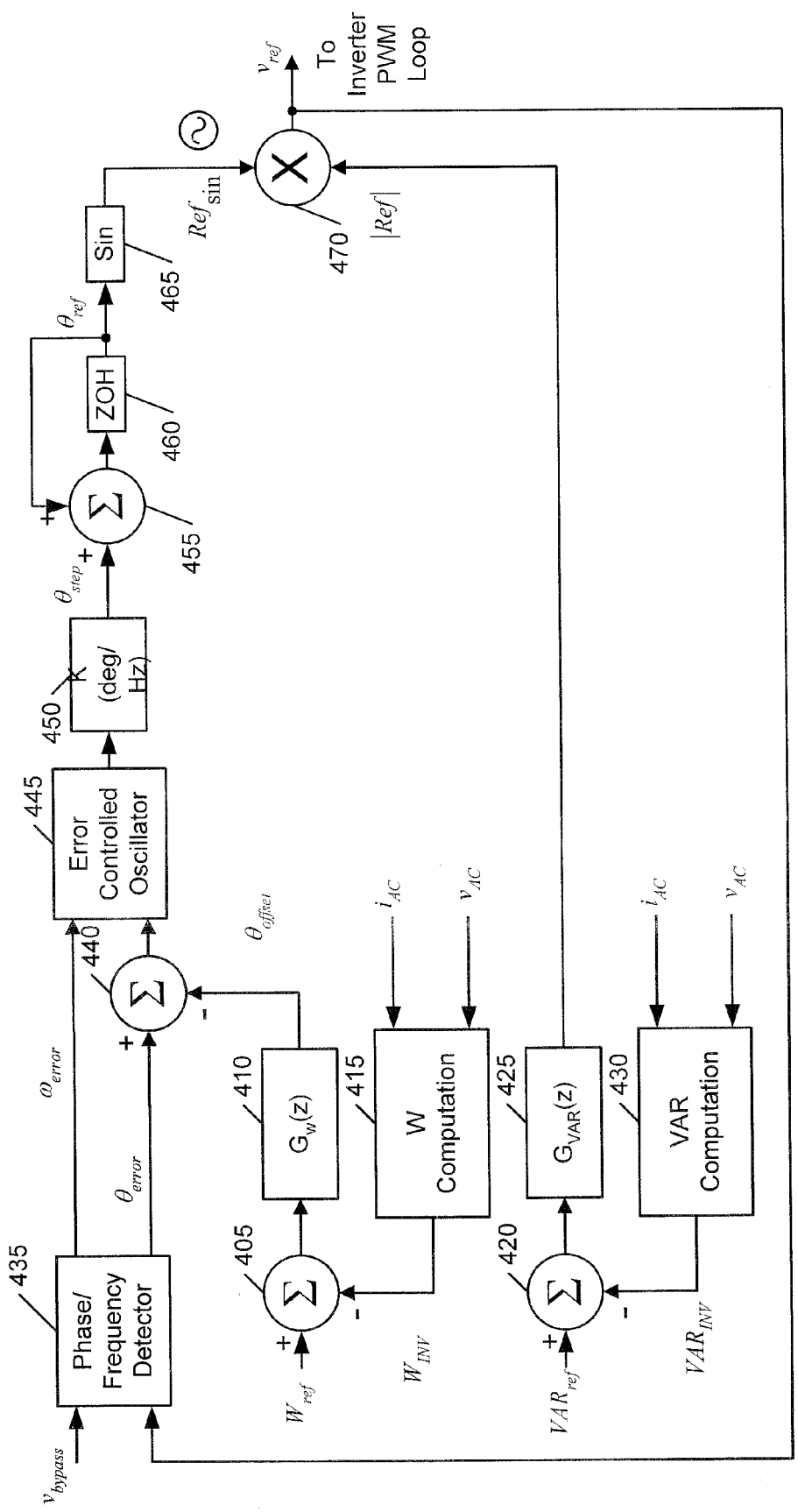
FIG. 4 is a schematic diagram illustrating an exemplary inverter control configuration according to further embodiments of the invention.

FIG. 4 illustrates an exemplary control loop configuration that may be implemented in the power control block 356 of FIG. 3. Respective real and reactive power computation blocks 415, 430 compute real and reactive power $W_{inv}$, $VAR_{inv}$ signals for the output 324 of the inverter circuit 320 responsive to phase current and voltage signals $i_{AC}$, $v_{AC}$ (e.g., signals representative of current and voltage at the output 324 of the inverter circuit 320). These real and reactive power signals $W_{inv}$, $VAR_{inv}$ are subtracted from respective real and reactive power reference (command) signals $W_{ref}$, $VAR_{ref}$ at respective summing junction blocks 405, 420 to generate respective real and reactive power error signals that are applied to respective compensation blocks 410, 425 that provide respective transfer functions $G_w(z)$, $G_{VAR}(Z)$. The output of the reactive power compensation block 425 is a magnitude reference signal |Ref| that is representative of a voltage magnitude at the output 322 of the bridge circuit 321 of the inverter circuit 320 that will cause the inverter circuit 320 to approach the real power transfer indicated by the reactive power reference signal $VAR_{ref}$. The output of the real power compensation block 410 is a phase offset signal $\theta_{offset}$ that is representative of a phase shift that will cause the inverter circuit 320 to approach the real power transfer indicated by the real power reference signal $W_{ref}$.

The phase offset signal $\theta_{offset}$ is provided to another summing junction block 440, where it is subtracted from a phase error signal $\theta_{error}$ produced by a phase/frequency detector block 435 responsive to a comparison of a signal $v_{bypass}$, which is representative of a voltage at the input 312 of the rectifier circuit 310 (and, due to the closed state of the bypass circuit 330, of the output 324 of the inverter circuit 320), to a reference signal $v_{ref}$ provided to the inverter PWM control circuit 358. The summing junction block 440 produces an adjusted error signal to an error controlled oscillator block 445, which also receives a frequency error signal $\omega_{error}$ from the phase/frequency detector block 435.

The error controlled oscillator block 445 responsively produces a frequency signal that is scaled by a gain block 450 before provision to an accumulator (integrator) including a summing junction block 455 and a zero-order hold (ZOH) block 460. In particular, the error controlled oscillator block 445 produces a signal representative of a desired frequency for the inverter reference signal $v_{ref}$, and the gain block converts this frequency signal into an angle per step signal $\theta_{step}$ signal that represents the number of degrees of a sine wave that corresponds to a computational interval of the accumulator including the summing junction block 455 and the ZOH block 460. The accumulator produces an angle reference signal $\theta_{ref}$, which is converted into a sinusoidal reference signal $Ref_{sin}$ by a sine function block 465, i.e., a block that computes sine values corresponding to the angle values of the angle reference signal $\theta_{ref}$. This sinusoidal reference signal $Ref_{sin}$ is multiplied by the magnitude reference signal |Ref| in a multiplier block 470 to produce the inverter reference signal $v_{ref}$.

It will be appreciated that the functional blocks in FIGS. 3 and 4 may be implemented in a number of different ways, such as software modules or objects. It will also be appreciated that the control structures of FIGS. 3 and 4 are provided for illustrative purposes, and that a variety of different inverter control structures may be used with the invention. Such control structures generally may include digital control structures, analog control structures and combinations thereof. For example, all or some of the digital function blocks illustrated in FIGS. 3 and 4 may be replaced with analog circuits that perform equivalent functions.

Figure 5:
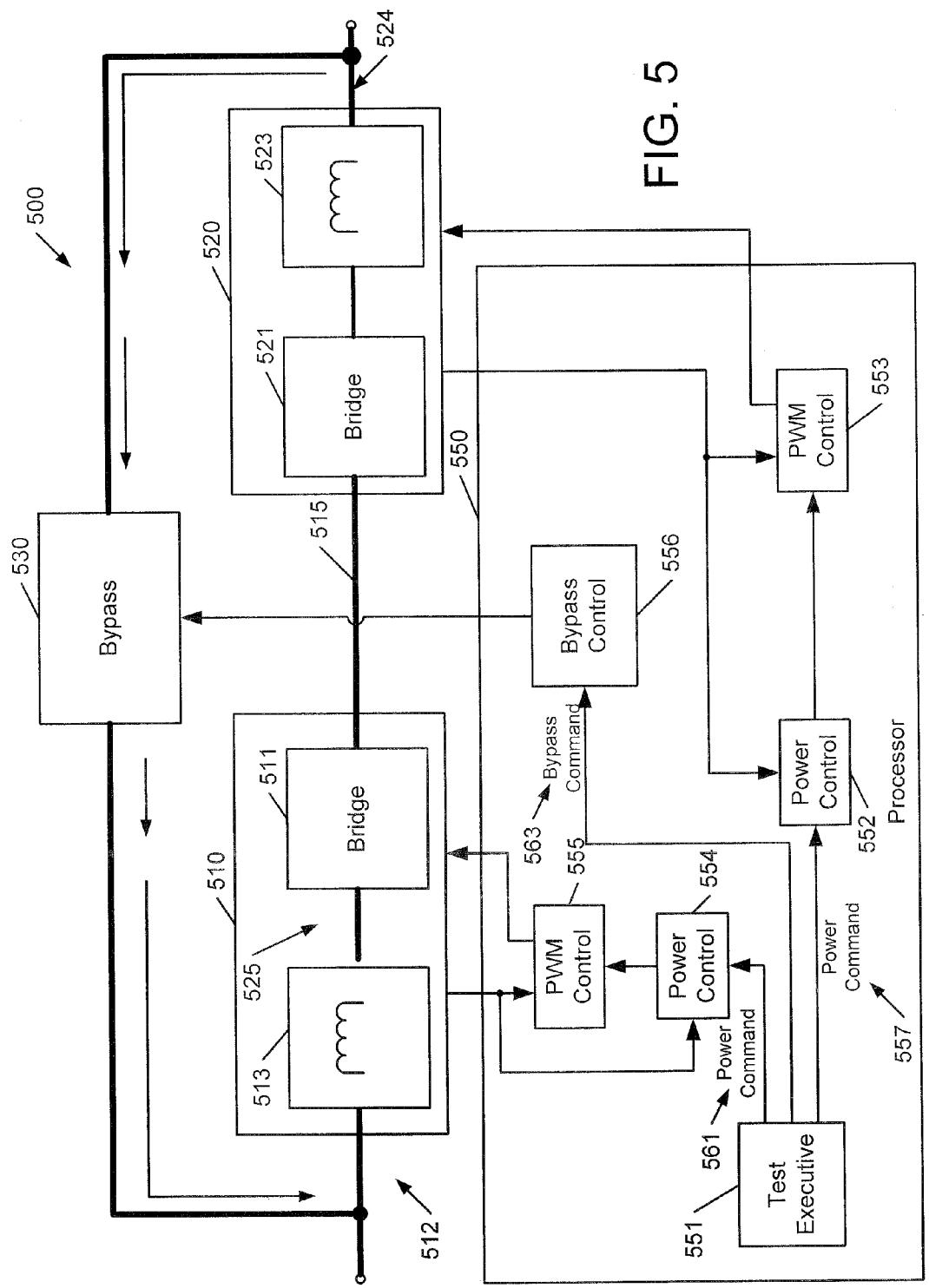
FIG. 5 is a schematic diagram illustrating power supply apparatus according to further embodiments of the invention.

As shown in FIG. 5, according to further embodiments of the invention, additional control may be provided for a rectifier of a power supply apparatus, such as the apparatus 300 of FIG. 3, such that real and/or reactive power transfer through the rectifier can be controlled in a manner similar to the inverter control described above. In particular, FIG. 5 illustrates a power supply apparatus 500 that includes a rectifier circuit 510 having an input 512 configured to be coupled to an AC source (not shown) and including a bridge circuit 511 coupled to the input 512 by an impedance 513. The rectifier circuit 510 is operative to provide power to a DC link 515 from AC power provided at its input 512. The apparatus 500 also includes an inverter circuit 520 coupled to the DC link 515 and an output 524 configured to be coupled to a load (not shown). The inverter circuit 520 is operative to provide AC power at its output from DC power provided via the DC link 515, and includes a bridge circuit 521 coupled to the DC link 515 and an impedance (e.g., an inductor) 523 that couples the bridge circuit 521 to the output 524. The apparatus 500 further includes a bypass circuit (e.g., a static switch) 530 that is operative to couple and decouple the input 512 of the rectifier circuit 510 and the output 524 of the inverter circuit 520.

The apparatus 500 also includes a processor 550 configured to provide control circuitry for the inverter circuit 520 and the bypass circuit 530, including a PWM control block 553, a power control block 552 and a bypass control block 556, which may operate along the lines discussed above with reference to FIGS. 3 and 4. The processor 550 is further configured to provide control circuitry for the rectifier circuit 510, including a PWM control block 555 and a power control block 554, which control the bridge circuit 511 of the rectifier circuit 510 responsive to feedback signals associated with the rectifier circuit 510. The power control block 554 and the PWM control block 555 are configured to vary a voltage magnitude and phase at a node 525 of the bridge circuit 511 responsive to a power command signal 561 to effect desired real and/or reactive power transfer at the input 512. A test executive block 551 provides the rectifier and inverter power command signals 557, 561, and also provides a bypass command signal 563 to the bypass control block 556.

FIGS. 6-10 are schematic diagrams that illustrate exemplary operations according to some embodiments of the invention that may be performed by an uninterruptible power supply (UPS) apparatus along the lines described above with reference to FIGS. 1-5. A power supply apparatus 600 includes a rectifier circuit 610 and an inverter circuit 620 coupled by a DC link 615. The apparatus 600 further includes a bypass circuit 630, and a battery (or other DC source) coupled to the DC link 615. It will be appreciated that the battery 640 may be directly coupled to the DC link 615, or may be coupled by a power converter circuit, e.g., a charger/converter circuit.

Figure 6:
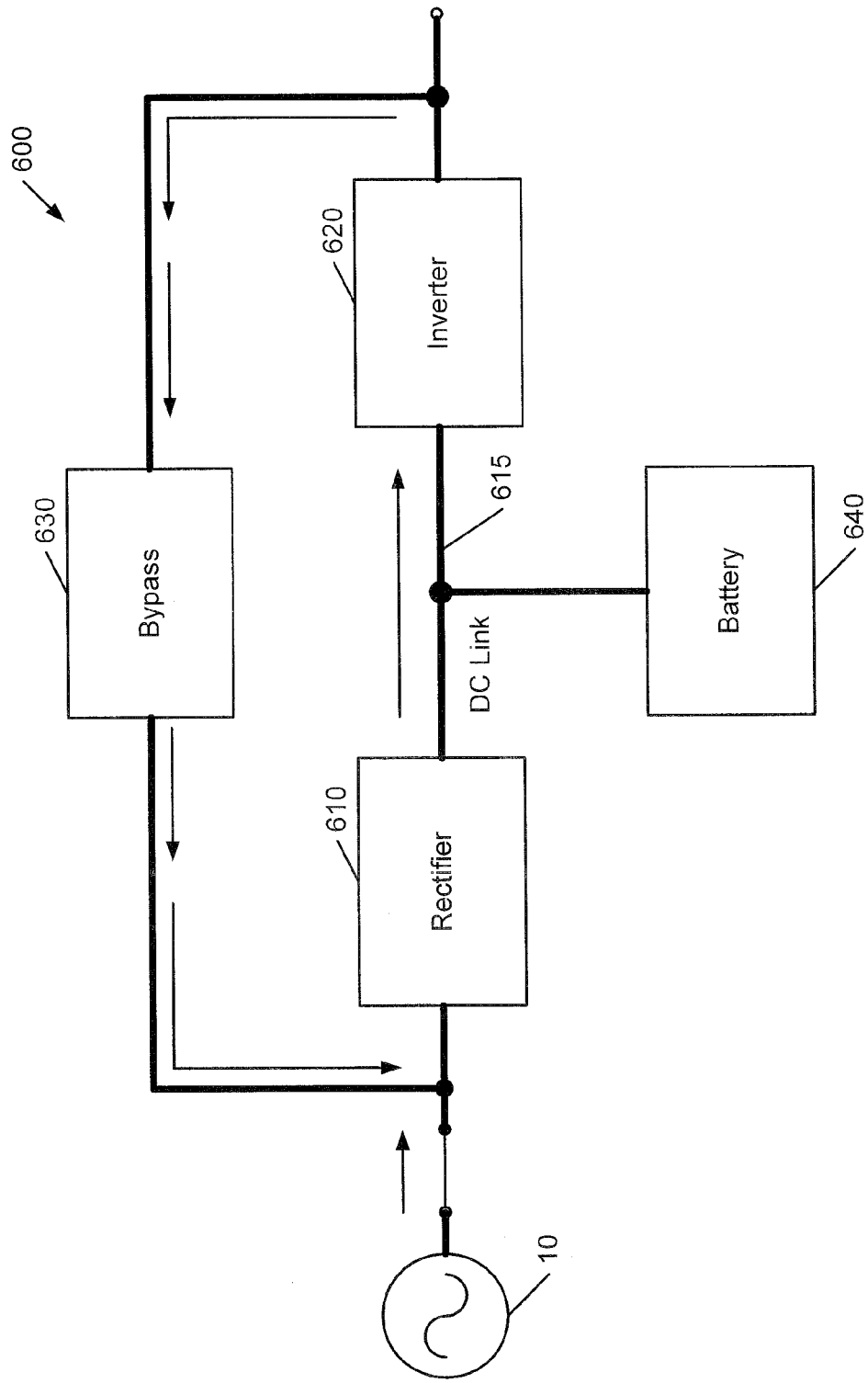
FIGS. 6-10 are schematic diagrams illustrating a UPS and exemplary test operations thereof according to further embodiments of the invention.
Figure 7:
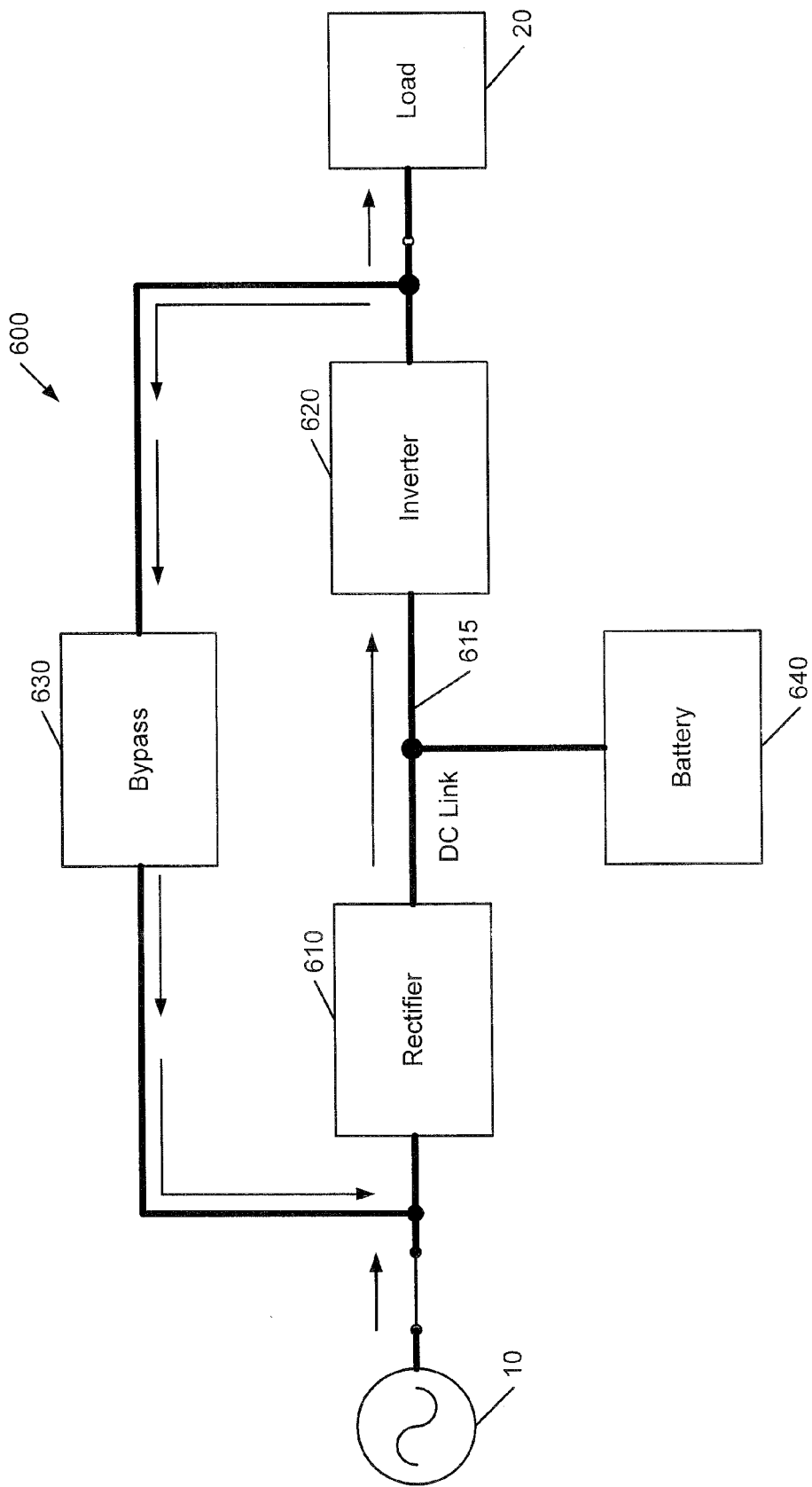
Figure 8:
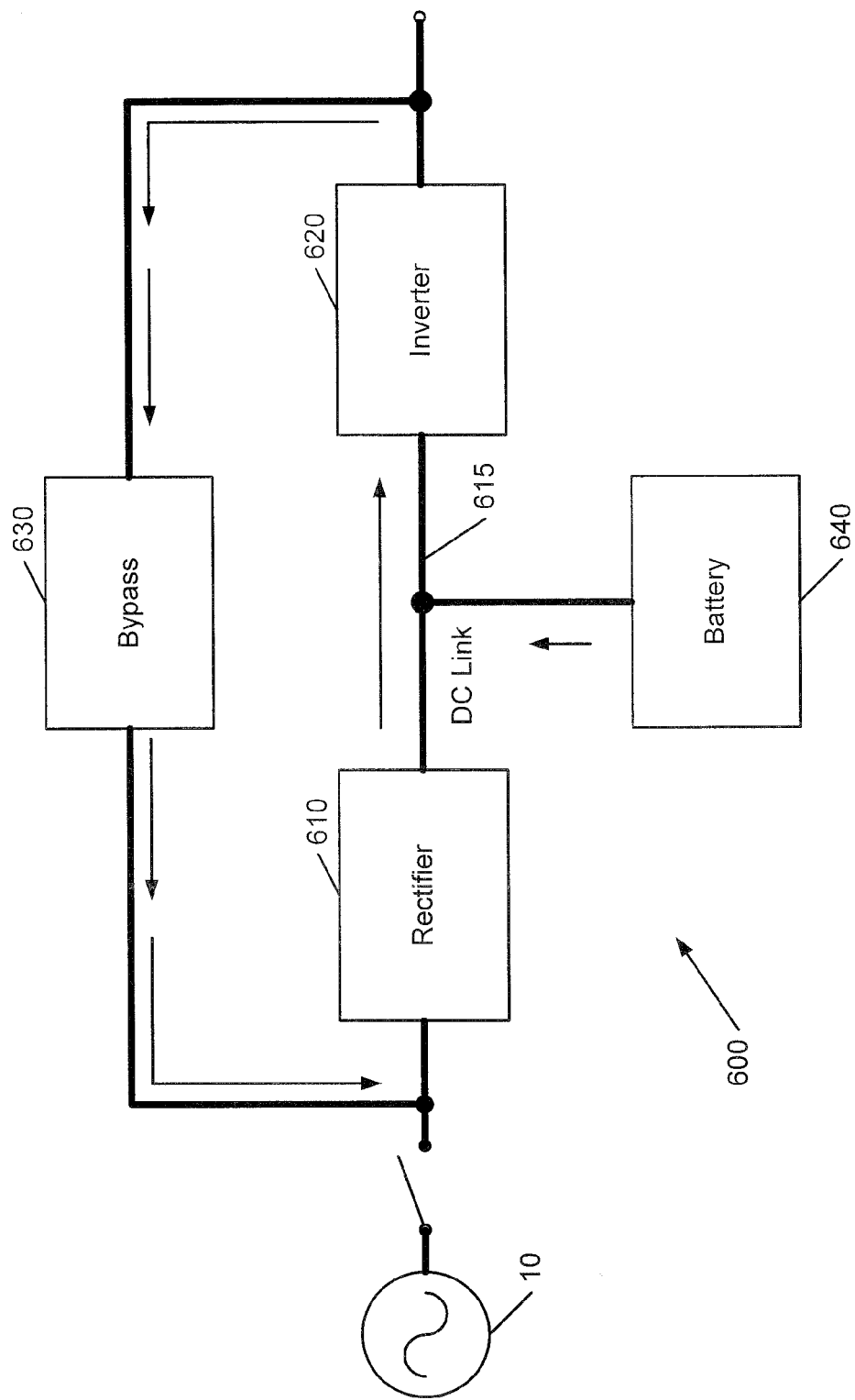
Figure 9:
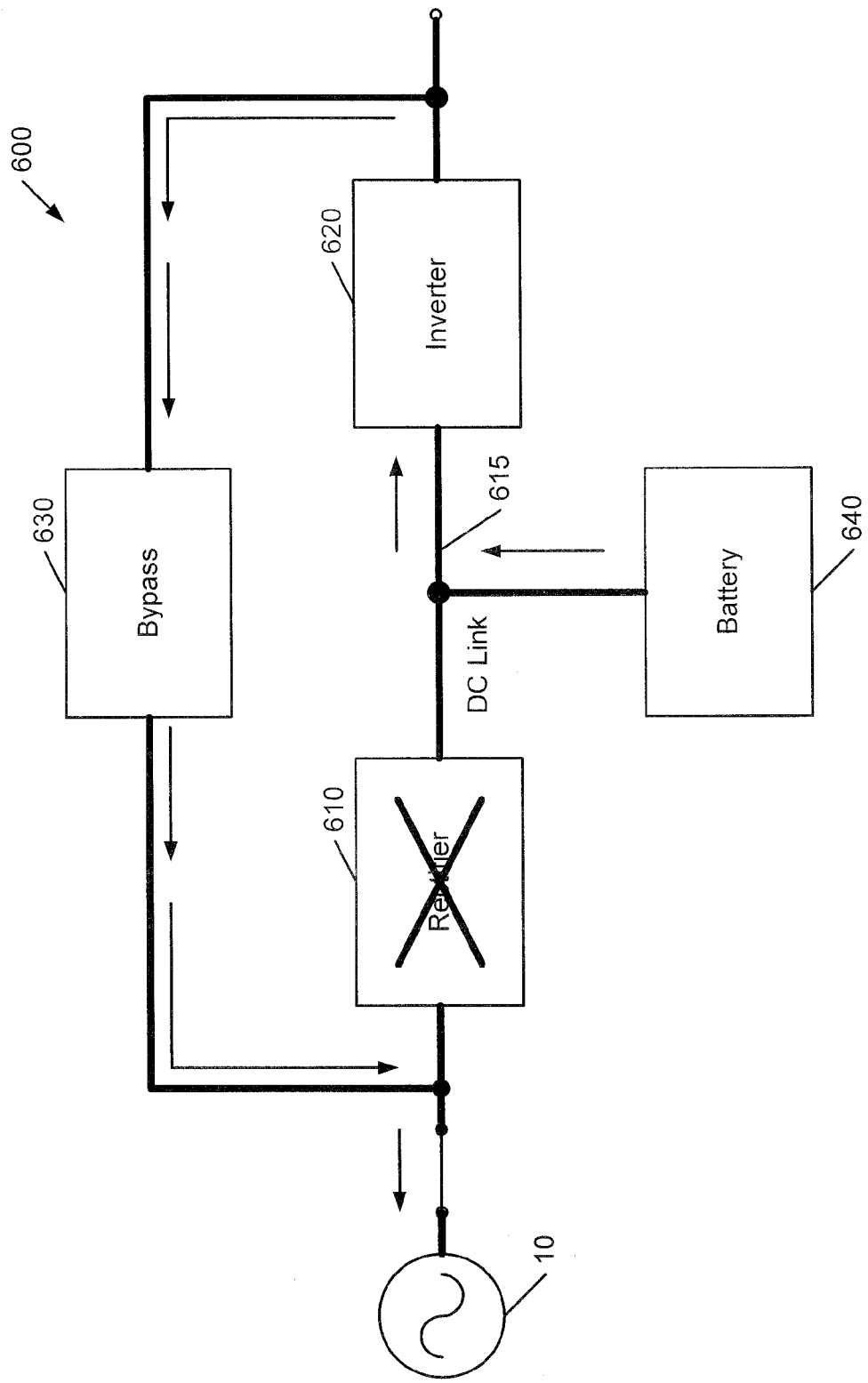

Still referring to FIG. 6, when an AC source 10 is coupled to the input of the apparatus 600, the bypass circuit 630, the rectifier circuit 610 and the inverter circuit 620 may be configured such that a circulating current is established therethrough. By controlling power transfer by the rectifier circuit 610 and the inverter circuit 620, the circulating current may be used to emulate load test current for components of the apparatus 600, including the rectifier, inverter and bypass circuits 610, 620, 630, as well as other components associated with the circulating current path, such as current and temperature sensors. In this manner, various burn-in, commissioning and/or other tests may be conducted. This approach can allow testing without an actual load connected to the apparatus 600, and can provide testing with minimal energy loss, as the AC source need only supply sufficient current to make up for losses in the apparatus 600. As shown in FIG. 7, according to further embodiments of the invention, such testing make even take place while the apparatus 600 is supplying power to a load 20. Such a technique may be particularly useful for performing maintenance tests in the field while still supporting critical loads. As shown in FIG. 8, the apparatus 600 may be tested by circulating power from the battery 640, without connection to an external AC source 10. As shown in FIG. 9, a discharge test of the battery 640 may be effected by disabling the rectifier circuit 610 and allowing current from the battery 640 flow through the inverter circuit 620 and the bypass circuit 630 into the external AC source 10.

Figure 10:
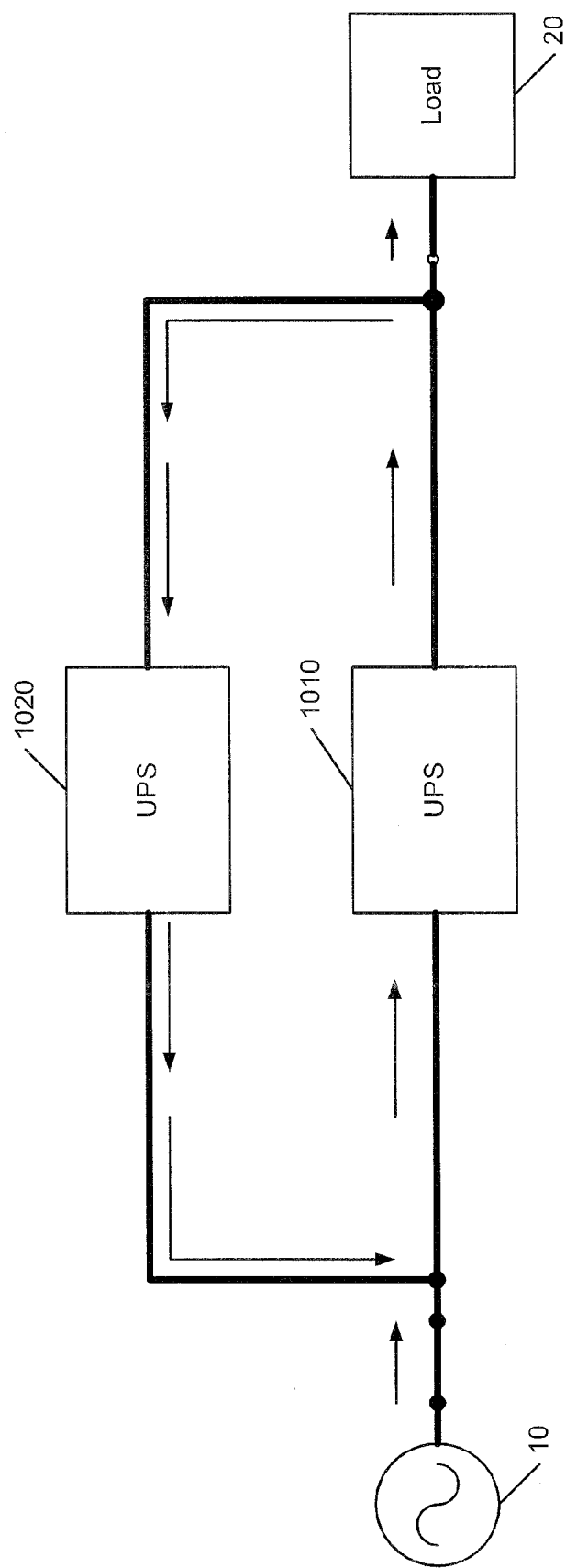

FIG. 10 illustrates a test configuration for parallel-connected UPSs 1010, 1020 according to further embodiments of the invention. In particular, desirable loading of components of the UPSs 1020, 1020 can be achieved by establishing a circulating current that passes through both of the UPSs 1010, 1020. Such a circulating test current could be established by operating one UPS 1020 in a "normal" fashion, while controlling the inverter and/or rectifier of the second UPS 1020 to provide synthetic additional loading of the first UPS 1010.

It will be appreciated that a variety of self-testing schemes fall within the scope of the invention. In some embodiments, if a rectifier of a UPS (or other power supply apparatus) has active components (e.g., along the lines illustrated in FIG. 5), the rectifier's reactive power transfer may be controlled to match reactive power transfer from the UPS's inverter, such that reactive loading of the utility if desired. Further enhancements can be made to produce circulating currents that represent other types of loads such as harmonic or non-linear loads using inverter and/or rectifier control. For example, the inverter and rectifier could be controlled with current commands such that the inverter produces harmonic test currents (e.g., to simulate a non-linear load), and the rectifier generates harmonic currents that cancel the harmonic test currents generated by the inverter to reduce or prevent degradation of a utility source.

Power supply configurations according to various embodiments of the invention, such as those described above with reference to FIGS. 6-10, shown can be used by a manufacturing facility, customer, or service organization to perform integrity testing. Power supply apparatus components that can be tested include, but are not limited to, inverter power train and control connections, rectifier power train and control connections, bypass module, contactors, breakers, feedback signals, control circuitry, control processors located inside the UPS. Further embodiments may test breakers or other switchgear. In some embodiments, thermal controls, such as fans, heat sinks, and temperature sensors may be tested. Embodiments of the invention may verify system performance requirements, such as efficiency.

According to additional embodiments, a manufacturing facility, customer, or service organization may perform load testing while using reduced or minimal power to enable energy savings. A manufacturing facility that is load testing one of more UPS' would not be required to install a large utility feed that would normally have to supply enough energy for all the UPSs that are tested, as the utility feed would only need to be large enough to cover the losses in the UPS. Testing may be controlled remotely via modem, network, internet, wireless or other communications device.

According to further aspects of the invention, UPS calibration could be automated. For example, if a bypass circuit is used to measure voltage and current and was known to be accurate, this information could be used to calibrate voltage and current measurements in other portions of the UPS. For example, the inverter and rectifier could be turned off but connected via a bypass. In this case no current would be circulating and one could adjust voltage measurements made by the inverter and rectifier so that they match the known accurate bypass voltage. Using a configuration as illustrated in FIG. 6, a circulating current could then be commanded, and rectifier and inverter current measured and sensor gains adjusted to match bypass current.

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A method of operating a power supply apparatus comprising first and second parallel-connected uninterruptible power supplies (UPSs), each including an AC/DC converter circuit and a DC/AC converter circuit having an input coupled to an output of the AC/DC converter circuit by a DC link, inputs of the AC/DC converter circuits of the first and second UPSs connected in common to an AC source and outputs of the DC/AC converter circuits of the first and second UPSs connected in common to a load, the method comprising:

test loading the first UPS by transferring power from the output of the DC/AC converter circuit of the first UPS to the output of the DC/AC converter circuit of the second UPS.

2. The method of claim 1, further comprising providing power to the load from the first UPS concurrent with test loading the first UPS by transferring power from the output of the DC/AC converter circuit of the first UPS to the output of the DC/AC converter circuit of the second UPS.

3. The method of claim 1, further comprising transferring power from the input of the AC/DC converter circuit of the second UPS to the input of the AC/DC converter circuit of the first UPS concurrent with test loading the first UPS by transferring power from the output of the DC/AC converter circuit of the first UPS to the output of the DC/AC converter circuit of the second UPS.

4. A power supply apparatus comprising:
first and second parallel-connected uninterruptible power supplies (UPSs), each including an AC/DC converter circuit and a DC/AC converter circuit having an input coupled to an output of the AC/DC converter circuit by a DC link, inputs of the AC/DC converter circuits of the first and second UPSs connected in common to an AC source and outputs of the DC/AC converter circuits of the first and second UPSs connected in common to a load, wherein the first and second UPSs are configured to support a test mode wherein the first UPS is test loaded by transferring power from the output of the DC/AC converter circuit of the first UPS to the output of the DC/AC converter circuit of the second UPS.

5. The apparatus of claim 4, wherein the first UPS is configured to provide power to the load concurrent with test loading the first UPS by transferring power from the output of the DC/AC converter circuit of the first UPS to the output of the DC/AC converter circuit of the second UPS.

6. The apparatus of claim 4, wherein the second UPS is configured to control the AC/DC converter circuit of the second UPS to transfer power from the input of the AC/DC converter circuit of the second UPS to the input of the AC/DC converter circuit of the first UPS concurrent with test loading the first UPS by transferring power from the output of the DC/AC converter circuit of the first UPS to the output of the DC/AC converter circuit of the second UPS.

* * * * *